US012500059B2

(12) United States Patent
Kozuka et al.

(10) Patent No.: US 12,500,059 B2
(45) Date of Patent: Dec. 16, 2025

(54) SAMPLE MILLING APPARATUS, SHIELD PLATE, AND SAMPLE MILLING METHOD

(71) Applicant: JEOL Ltd., Tokyo (JP)

(72) Inventors: Munehiro Kozuka, Tokyo (JP); Tsutomu Negishi, Tokyo (JP); Tatsuhito Kimura, Tokyo (JP)

(73) Assignee: JEOL Ltd., Tokyo (JP)

( * ) Notice: Subject to any disclaimer, the term of this patent is extended or adjusted under 35 U.S.C. 154(b) by 340 days.

(21) Appl. No.: 18/368,789

(22) Filed: Sep. 15, 2023

(65) Prior Publication Data

US 2024/0096584 A1 Mar. 21, 2024

(30) Foreign Application Priority Data

Sep. 16, 2022 (JP) ................................ 2022-147736

(51) Int. Cl.
*H01J 37/09* (2006.01)
*H01J 37/305* (2006.01)

(52) U.S. Cl.
CPC ............ *H01J 37/09* (2013.01); *H01J 37/305* (2013.01)

(58) Field of Classification Search
CPC ...... H01J 37/09; H01J 37/305; H01J 2237/08; H01J 2237/2007; H01J 2237/3151; H01J 2237/31745; H01J 37/3053; H01J 37/3056; H01J 37/20; G01N 1/286; G01N 1/32
USPC .................................................... 250/440.11
See application file for complete search history.

(56) References Cited

U.S. PATENT DOCUMENTS

2005/0081997 A1* 4/2005 Yoshioka ................. G01N 1/32 156/345.39
2018/0358201 A1* 12/2018 Negishi ................... H01J 37/20

FOREIGN PATENT DOCUMENTS

JP 200562131 A 3/2005
JP 2009174940 A 8/2009
JP 2019003732 A 1/2019

OTHER PUBLICATIONS

Office Action issued in JP2022147736 on Aug. 13, 2024.
Extended European Search Report issued in EP23191520.8 on Jan. 18, 2024.

* cited by examiner

*Primary Examiner* — Michael Maskell
(74) *Attorney, Agent, or Firm* — The Webb Law Firm

(57) ABSTRACT

There is provided a sample milling apparatus capable of mitigating heat damage to a sample. The apparatus mills the sample by irradiating it with an ion beam and includes: an ion source for emitting the ion beam; and a shield plate placed on the sample and covering a part of the sample. The shield plate includes: a shield surface on which the ion beam impinges; and a bottom surface connected to the shield surface and forming a bottom edge. The bottom surface is smaller in area than the shield surface.

13 Claims, 7 Drawing Sheets

SAMPLE MILLING APPARATUS, SHIELD PLATE, AND SAMPLE MILLING METHOD

CROSS-REFERENCE TO RELATED APPLICATION

This application claims priority to Japanese Patent Application No. 2022-147736, filed Sep. 16, 2022, the disclosure of which is hereby incorporated by reference in its entirety.

BACKGROUND OF THE INVENTION

1. Field of the Invention

The present invention relates to a sample milling apparatus, a shield plate, and a sample milling method.

2. Description of Related Art

Cross Section Polisher (a trademark registered) is known as an apparatus for milling a sample using an ion beam. In particular, the Cross Section Polisher forms a cross section along a boundary between irradiated and non-irradiated regions by placing a shield plate on a sample and irradiating it with an ion beam. The irradiated region is etched by the ion beam, while the non-irradiated region is shielded by the shield plate and thus is not etched by the ion beam.

JP-A-2005-062131 discloses a shield plate having an edge portion which defines irradiated and non-irradiated regions and which is greater in depth than the other portions. The shield plate is placed on the sample in intimate contact therewith.

With the Cross Section Polisher, about a half of the ion beam strikes the shield plate and, therefore, heat generated in the shield plate flows into the sample. As a result, the sample may be damaged.

SUMMARY OF THE INVENTION

One aspect of the sample milling apparatus associated with the present invention is operative to mill a sample by irradiating it with an ion beam and includes: an ion source for emitting the ion beam; and a shield plate placed on the sample and covering a part of the sample. The shield plate includes: a shield surface on which the ion beam impinges; and a bottom surface connected to the shield surface and forming a bottom edge. The bottom surface is smaller in area than the shield surface.

In this sample milling apparatus, the bottom surface of the shield plate is smaller in area than the shield surface and, therefore, heat generated in the shield plate due to the ion beam irradiation of the shield plate is suppressed from flowing into the sample as compared to the case where the bottom surface is equal to or greater in area than the shield surface. Consequently, in this sample milling apparatus, thermal damage to the sample can be reduced.

One aspect of the shield plate associated with the present invention is for use with a sample milling apparatus for milling a sample by irradiating it with an ion beam. The shield plate is placed on the sample and covers a part of the sample. The shield plate comprises: a shield surface on which the ion beam impinges; and a bottom surface connected to the shield surface and forming a bottom edge. The bottom surface is smaller in area than the shield surface.

In this shield plate, the bottom surface is smaller in area than the shield surface and so heat generated in the shield plate due to ion beam irradiation of the shield plate is suppressed from flowing into the sample as compared to where the bottom surface is greater in area than the shield surface. Consequently, this shield plate causes less thermal damage to the sample.

One aspect of the sample milling method associated with the present invention starts with preparing the above-described shield plate. Then, the shield plate is placed on the sample, and a part of the sample is covered by the shield plate. The shield plate and the sample are irradiated with an ion beam.

In this sample milling method, the bottom surface of the shield plate is smaller in area than the shield surface and, therefore, heat generated in the shield plate due to ion beam irradiation of the shield plate is suppressed from flowing into the sample as compared to where the bottom surface is greater in area than the shield surface. Consequently, in this sample milling method, there occurs less thermal damage to the sample.

DESCRIPTION OF THE INVENTION

The preferred embodiments of the present invention are hereinafter described in detail with reference to the drawings. Note that the embodiments provided below are not intended to unduly restrict the contents of the present invention delineated by the claims and that not all the configurations set forth below are essential constituents of the present invention.

1. Sample Milling Apparatus

Figure 1:
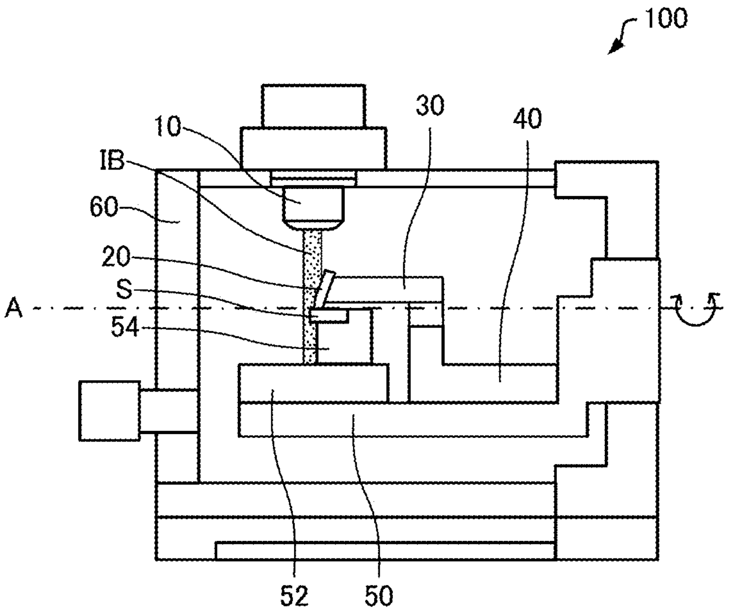
FIG. 1 is a diagram showing the configuration of a sample milling apparatus associated with one embodiment of the present invention.

A sample milling apparatus associated with one embodiment of the present invention is first described by referring to FIG. 1, which shows the configuration of the sample milling apparatus, 100.

The sample milling apparatus 100 mills a sample S by irradiating it with an ion beam IB. The milling apparatus 100 can prepare a cross-sectional sample, for example, for use in scanning electron microscopy.

As shown in FIG. 1, the sample milling apparatus 100 includes an ion source 10, a shield plate 20, a shield plate holder 30, a support member 40, a sample stage 50, and a chamber 60.

The ion source 10 is mounted at the top of the chamber 60 and emits the ion beam IB at the sample S. For example, the ion source 10 is an ion gun which emits the ion beam IB by accelerating ions at a given acceleration voltage. An Ar ion beam can be used as the ion beam IB, for example.

Figure 2:
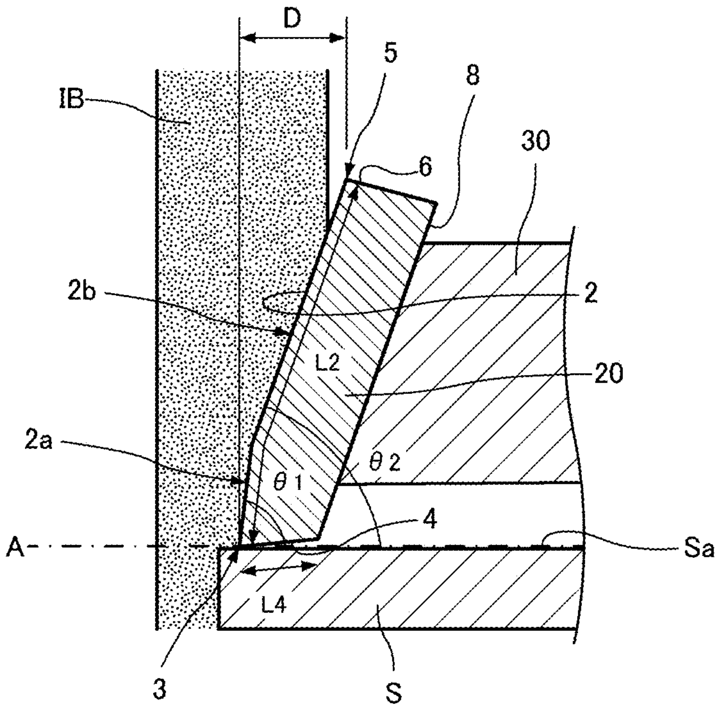
FIG. 2 is a schematic cross-sectional view of a shield plate.

Referring also to FIG. 2, the shield plate 20 is placed on the sample S so as to cover a part of the top surface Sa of the sample S. By emitting the ion beam IB while placing the shield plate 20 on the sample S, a cross section can be formed along the boundary between irradiated and non-irradiated regions. The irradiated region is etched by the ion beam IB, while the non-irradiated region is shielded by the shield plate 20 and thus is not etched.

The shield plate holder 30 mechanically holds the shield plate 20. The support member 40 mechanically supports the shield plate holder 30 and is equipped with a shield plate position adjusting mechanism for adjusting the position of the shield plate 20.

The sample stage 50 is provided with a sample position adjusting mechanism 52 on which a sample holder 54 for holding the sample S is mounted. The position of the sample S can be adjusted by the sample position adjusting mechanism 52.

The sample stage 50 is equipped with a rotary mechanism capable of rotating both the sample S held to the sample holder 54 and the shield plate 20 about an axis A which is perpendicular to the optical axis of the ion beam IB. The rotary mechanism is driven by an electric motor, for example. With the sample milling apparatus 100, the ion beam IB can be directed at the sample S while swinging the sample S and the shield plate 20 about the axis A by the rotary mechanism.

In the sample milling apparatus 100, the shield plate position adjusting mechanism and the sample position adjusting mechanism 52 together permit the positional relationship between the shield plate 20 and the sample S to be adjusted. Furthermore, these two adjusting mechanisms allow adjustments of the positional relationship between the sample S and the ion source 10 and of the positional relationship between the shield plate 20 and the ion source 10.

The sample S can be received within the chamber 60 whose interior can be evacuated to a vacuum by a vacuum pump (not shown). In the chamber 60, the sample S is irradiated with the ion beam IB.

The sample milling apparatus 100 may be equipped with a camera for checking the positions of the shield plate 20 and sample S. The apparatus 100 may also be equipped with a camera for checking how the sample S has been milled in a manner not illustrated.

2. Shield Plate

Figure 3:
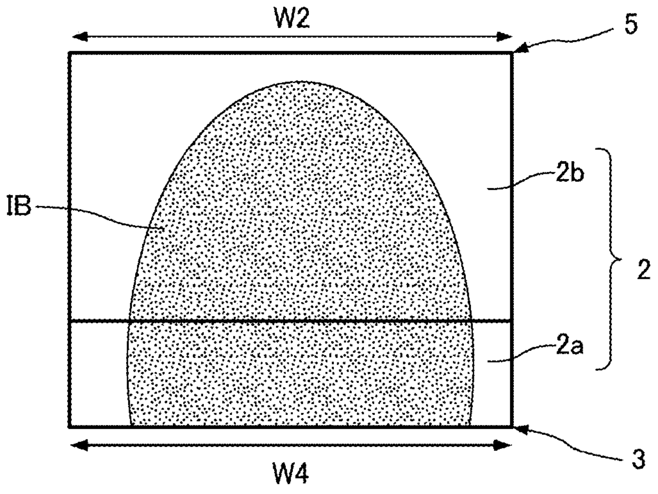
FIG. 3 is a schematic plan view of a shield surface.

FIG. 2 is a schematic cross-sectional view of the shield plate 20. As shown, the shield plate 20 is placed on the sample S, i.e., on its top surface Sa. The ion beam IB is directed perpendicularly to the axis of rotation A (swing axis) of both the sample S and the shield plate 20. The axis A passes through the boundary between the top surface Sa of the sample S and the shield plate 20, the top surface Sa being parallel to the axis A. In the sample milling apparatus 100, a cross section vertical to the top surface Sa can be formed by irradiating the top surface Sa of the sample S parallel to the axis A with the ion beam IB. As also shown in FIG. 2, the shield plate 20 includes a shield surface 2, a bottom surface 4, a top surface 6, and a back surface 8. FIG. 3 is a schematic plan view of the shield surface 2. The shield surface 2 is a surface on which the ion beam IB impinges. As shown in FIGS. 2 and 3, the shield surface 2 has a first tilted surface **2*a* and a second tilted surface 2*b***.

The first tilted surface **2*a* is connected to the bottom surface 4. The first tilted surface 2*a* and the bottom surface 4 together form a bottom edge 3. As shown in FIG. 2, the first tilted surface 2*a* is not vertical but is slightly tilted relative to a line normal to the top surface Sa of the sample S. The first tilted surface 2*a* and the top surface Sa of the sample S define an acute angle $\theta 1$ therebetween. For example, $85° < \theta 1 < 90°$. Because the first tilted surface 2*a* is tilted relative to the line normal to the top surface Sa of the sample S, if the illumination angle of the ion beam IB deviates, the shield plate 20** can be prevented from creating a shadow on the top surface Sa of the sample S.

Figure 4:
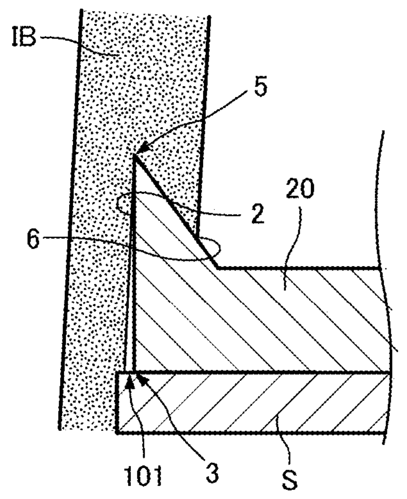
FIG. 4 Prior Art
FIG. 4 is a schematic cross-sectional view of a conventional shield plate.

FIG. 4 is a schematic cross-sectional view of a conventional shield plate 20. Where the shield surface 2 of the shield plate 20 is vertical as shown in FIG. 4, if the illumination angle of the ion beam IB deviates, a shadow 101 of the shield plate 20 is produced on the top surface Sa, in which case a cross section can no longer be formed along the boundary created by the bottom edge 3 defined by the shield surface 2 and the bottom surface 4. In contrast, with the inventive shield plate 20 of FIG. 2, even if the illumination angle of the ion beam IB deviates, it is possible to prevent the shield plate 20 from creating the shadow 101 on the top surface Sa of the sample S by tilting the first tilted surface **2*a***.

If the angle $\theta 1$ between the first tilted surface **2*a* and the top surface Sa of the sample S decreases, illumination by the ion beam IB promotes etching of the shield plate 20. As a result, the shield plate 20 will be consumed earlier. For this reason, we define $85° < \theta 1 < 90°$, where $\theta 1$ is the angle formed between the first tilted surface 2*a*** and the top surface Sa of the sample S.

The second tilted surface **2*b* is connected to the first tilted surface 2*a* and to the top surface 6. The second tilted surface 2*b* and the top surface 6 together form a top edge 5. The tilt angle of the second tilted surface 2*b* relative to the top surface Sa of the sample S is smaller than that of the first tilted surface 2*a*. The angle $\theta 2$ formed between the second tilted surface 2*b*** and the top surface Sa of the sample S is an acute angle. For example, $65° < \theta 2 < \theta 1$.

The cross-sectional shape of the sample S is affected by the shape or profile of the shield surface 2, especially by the shapes or profiles of the first tilted surface **2*a* and the bottom edge 3. In contrast, the shape or profile of the second tilted surface 2*b* hardly affects the cross-sectional shape of the sample S. Therefore, the first tilted surface 2*a* must be ground accurately but the second tilted surface 2*b* is not required to be ground accurately. In this way, in the shield plate 20, the shield surface 2 has the first tilted surface 2*a* and the second tilted surface 2*b* and so the accurately ground region can be narrowed. Consequently, the shield plate 20 can be manufactured with greater ease. For example, where the shield surface 2 consists of one tilted surface as shown in FIG. 4, the whole shield surface 2** must be ground accurately.

The bottom surface 4 faces the top surface Sa of the sample S and is connected to the shield surface 2. The shield surface 2 and the bottom surface 4 together form the bottom edge 3. In the illustrated example, the first tilted surface **2*a* is connected to the bottom surface 4, thus forming the bottom edge 3 which in turn defines the boundary between the irradiated region etched by the ion beam IB and the non-irradiated region blocked by the shield plate 20** and not etched by the ion beam IB.

In the sample milling apparatus 100, the shield plate 20 is supported by the shield plate holder 30 such that only the bottom edge 3 abuts the top surface Sa of the sample S. In the example of FIG. 2, the bottom surface 4 of the shield plate 20 is not in contact with the top surface Sa of the sample S but only the bottom edge 3 is in contact with the top surface Sa. Because the bottom surface 4 is tilted relative to the top surface Sa of the sample S, the bottom surface 4 is not in contact with the sample S. In the shield plate 20, the bottom surface 4 does not touch the sample S and so the bottom surface 4 is not required to be ground accurately.

The bottom surface 4 is smaller in area than the shield surface 2. The total length W2 of the shield surface 2 taken along the bottom edge 3 and the total length W4 of the bottom surface 4 taken along the bottom edge 3 are equal. The total length L2 of the shield surface 2 taken perpendicular to the bottom edge 3 is greater than the total length L4 of the bottom surface 4 taken perpendicular to the bottom edge 3. The length W4 of the bottom surface 4 is greater than the length L4 of the bottom surface 4. Since the length W4 of the bottom surface 4 must be greater than the diameter of the ion beam IB, the area of the bottom surface 4 is reduced by reducing the length L4 of the bottom surface 4. In the shield plate 20, the length L4 of the bottom surface 4 is small and, therefore, the amount of deformation of the shield plate 20 along the length L4 due to thermal expansion is small. In consequence, in the shield plate 20, shifting of the bottom edge 3 due to heat is small.

In the sample milling apparatus 100, the area of the bottom surface 4 is made smaller than that of the shield surface 2. Therefore, heat generated in the shield plate 20 due to the irradiation by the ion beam IB is suppressed from flowing into the sample S as compared to the case where the area of the bottom surface 4 is equal to or greater than that of the shield surface 2. Consequently, thermal damage to the sample S can be decreased. Furthermore, in the sample milling apparatus 100, the area of contact between the sample S and the shield plate 20 is smaller than the area of the shield surface 2 of the shield plate 20 and so heat generated in the shield plate 20 due to irradiation by the ion beam IB can be suppressed from flowing into the sample S in the sample milling apparatus 100.

The top surface 6 is connected to the second tilted surface 2*b* of the shield surface 2 which cooperates with the top surface 6 to form the top edge 5. The top edge 5 is located at a position where the intensity of the ion beam IB is low, and is shaped such that it can be easily etched by the ion beam IB. Therefore, for example, if strong ion beam IB strikes the top edge 5 formed by the shield surface 2 and top surface 6 as shown in FIG. 4, the top edge 5 will be selectively etched, consuming the shield plate 20. Consumption of the shield plate 20 can be reduced by placing the top edge 5 at a position where the intensity of the ion beam IB is low.

For example, the distance D between the top edge 5 and the bottom edge 3 taken along the line normal to the top surface Sa of the sample S (i.e., taken in the direction of irradiation by the ion beam IB) is greater than the half width at half maximum of the strength of the ion beam IB which is a half of the full width at half maximum. Since the center axis of the ion beam IB is located on the bottom edge 3, the top edge 5 can be placed at a position where the intensity of the ion beam IB is low by making the distance D greater than the half width at half maximum of the intensity of the ion beam TB. This can prevent strong ion beam IB from striking the top edge 5.

Because the shield surface 2 has the second tilted surface 2*b*, the shield plate 20 is prevented from increasing in size. Furthermore, the top edge 5 can be placed at a position where the intensity of the ion beam IB is low. For example, if the shield surface 2 is made of only one tilted surface, the height of the shield plate 20 must be increased in order to place the top edge 5 formed by the shield surface 2 and top surface 6 at a position where the intensity of the ion beam IB is low. This will reduce the distance between the shield plate 20 and the ion source 10.

In contrast, the shield surface 2 has the second tilted surface 2*b* having a tilt angle smaller than that of the first tilted surface 2*a*. This prevents the height of the shield plate 20 from increasing and permits placement of the top edge 5 at a position where the intensity of the ion beam IB is low. Therefore, the top edge 5 can be placed at a position where the intensity of the ion beam IB is low while appropriately maintaining the distance between the shield plate 20 and the ion source 10.

The back surface 8 is on the opposite side of the shield surface 2 and connected to the top surface 6. The back surface 8 is connected to the bottom surface 4. The shield plate holder 30 is connected to the back surface 8.

The shield plate holder 30 dissipates away the heat from the shield plate 20. The shield plate holder 30 is higher in thermal conductivity than the shield plate 20. The shield plate 20 is made, for example, of stainless steel. The shield plate holder 30 is made, for example, of copper.

Heat generated in the shield plate 20 in response to the irradiation by the ion beam IB is dissipated away through the shield plate holder 30. In the shield plate 20, the shield surface 2 has a large area and so the back surface 8 can also have a large area. For example, the area of the back surface 8 is greater than that of the bottom surface 4. Therefore, the area of contact between the shield plate 20 and the shield plate holder 30 can be made greater than that between the shield plate 20 and the sample S. Consequently, heat can be efficiently dissipated away from the shield plate 20. Furthermore, inflow of heat into the sample S can be reduced. As a result, temperature rises in the sample S can be suppressed.

In this way, heat produced in the shield plate 20 because of irradiation by the ion beam IB can be dissipated away efficiently. Therefore, the shield plate 20 is not required to be made of a material of a low coefficient of thermal expansion such as Super Invar. This offers great latitude in selecting the material of the shield plate 20. For example, a homogeneous material that is easy to grind can be selected as the material of the shield plate 20.

3. Sample Milling Method

Figure 5:
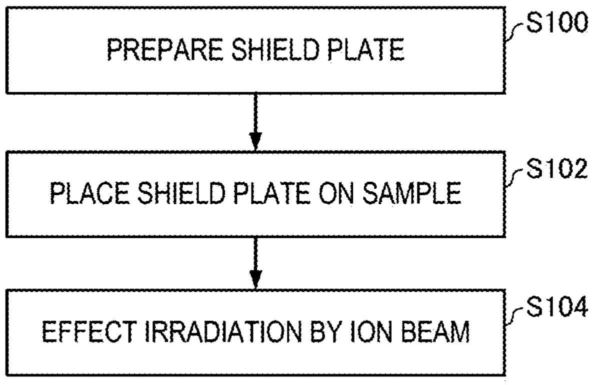
FIG. 5 is a flowchart illustrating one example of sample milling method using the sample milling apparatus of FIG. 1.

FIG. 5 is a flowchart illustrating one example of a sample milling method using the sample milling apparatus 100. First, the shield plate 20 is prepared (S100). Then, the shield plate 20 is placed on the sample S, and a part of the sample S is covered by the shield plate 20 (S102).

As shown in FIG. 2, the shield plate 20 is mounted to the shield plate holder 30. The bottom edge 3 of the shield plate 20 is placed at a position on the sample S where a cross section is prepared. At this time, the shield plate 20 is placed on the sample S such that only the bottom edge 3 of the shield plate 20 abuts the top surface Sa of the sample S. The position of the shield plate 20 can be adjusted with the shield plate position adjusting mechanism. The position of the sample S can be adjusted with the sample position adjusting mechanism 52. The position of the bottom edge 3 of the shield plate 20 is aligned to the position of impingement of the ion beam IB. For example, the shield plate 20 and the sample S are positionally adjusted such that the center of the ion beam IB is located on the bottom edge 3.

Then, the shield plate 20 and the top surface Sa of the sample S are irradiated with the ion beam IB (S104). As shown in FIG. 1, the interior of the chamber 60 is evacuated to a vacuum, and the ion beam IB is emitted from the ion source 10. At this time, the sample S and the shield plate 20 may be swung. A cross section of the sample S can be formed along the bottom edge 3 by emitting the ion beam IB while covering a part of the sample S with the shield plate 20.

Because of the foregoing processing steps, a cross section of the sample S can be produced. The resulting cross section of the sample S can be observed with a scanning electron microscope or other instrument.

4. Advantageous Effects

The sample milling apparatus 100 includes the shield plate 20 which is placed on the sample S and which covers a part of the sample S. The shield plate 20 includes both the shield surface 2 irradiated by the ion beam IB and the bottom surface 4 connected to the shield surface 2 and forming the bottom edge 3. The area of the bottom surface 4 is smaller than that of the shield surface 2. Consequently, in the sample milling apparatus 100, heat generated in the shield plate 20 in response to the irradiation by the ion beam IB is suppressed from flowing into the sample S, for example, as compared to the case where the area of the bottom surface 4 is equal to or greater than that of the shield surface 2. As a result, thermal damage to the sample S can be reduced.

Furthermore, by making the area of the shield surface 2 greater than that of the bottom surface 4, the area of the back surface 8 can be enlarged. This can increase the area of contact between the shield plate 20 and the shield plate holder 30. Heat generated in the shield plate 20 can be dissipated away through the shield plate holder 30.

The sample milling apparatus 100 includes the shield plate holder 30 that mechanically supports the shield plate 20 such that only the bottom edge 3 formed by the shield surface 2 and bottom surface 4 abuts the sample S. Consequently, in the sample milling apparatus 100, heat generated in the shield plate 20 is suppressed from flowing into the sample S as compared to the case where the whole bottom surface 4 touches the sample S.

In the sample milling apparatus 100, the shield surface 2 includes the first tilted surface 2*a* tilted relative to the top surface Sa of the sample S and the second tilted surface 2*b* tilted at a smaller tilt angle relative to the top surface Sa of the sample S than the first tilted surface 2*a*. The first tilted surface 2*a* is connected to the bottom surface 4 while the second tilted surface 2*b* is connected to the first tilted surface 2*a*. Therefore, the sample milling apparatus 100 can prevent the ion beam IB of strong intensity from striking the top edge 5 of easily etchable shape while suppressing increases in size of the shield plate 20.

In the sample milling apparatus 100, the shield plate 20 includes the top surface 6 connected to the shield surface 2. The distance D between the top edge 5 formed by the shield surface 2 and top surface 6 and the bottom edge 3 formed by the shield surface 2 and bottom surface 4 as taken along the normal to the top surface Sa of the sample S is greater than the half width at half maximum of the intensity of the ion beam IB. This can prevent the ion beam IB of strong intensity from hitting the top edge 5 of easily etchable shape.

In the sample milling apparatus 100, the area of contact between the shield plate 20 and the shield plate holder 30 is greater than that between the shield plate 20 and the sample S. Therefore, in the sample milling apparatus 100, heat generated in the shield plate 20 can be dissipated away through the shield plate holder 30. Furthermore, inflow of heat into the sample S can be reduced. Hence, thermal damage to the sample S can be reduced.

In the sample milling apparatus 100, the coefficient of thermal conductivity of the shield plate holder 30 is higher than that of the shield plate 20 and so in the milling apparatus 100, heat generated in the shield plate 20 can be efficiently dissipated away through the shield plate holder 30.

The sample milling method using the sample milling apparatus 100 involves the steps of: placing the shield plate 20 on the sample S and covering a part of the sample S by the shield plate 20; and irradiating the shield plate 20 and the sample S with the ion beam IB. With this sample milling method, therefore, heat damage to the sample S can be reduced.

5. Modifications

It is to be understood that the present invention is not restricted to the foregoing embodiments but rather can be implemented in variously modified forms without departing from the gist of the present invention. In the following description, only differences with the foregoing embodiments are set forth; a description of similarities is omitted.

5.1. First Modification

Figure 6:
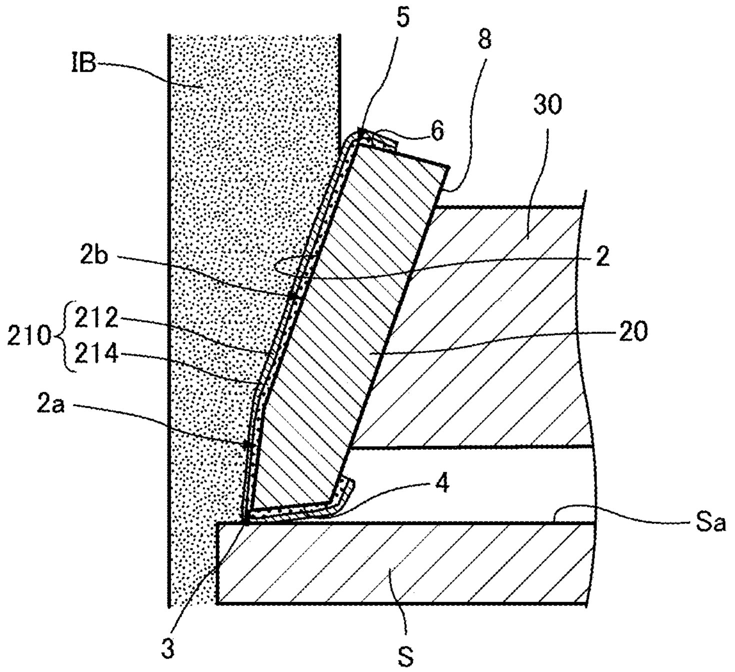
FIG. 6 is a cross-sectional view illustrating a modification of the sample milling method of FIG. 5.

FIG. 6 illustrates a modification of the sample milling method. The sample milling apparatus 100 includes an electrically conductive tape 210 with which the shield surface 2 and the bottom edge 3 of the shield plate 20 are covered as shown in FIG. 6. In the illustrated example, the bottom surface 4, the top edge 5, and the top surface 6 are covered with the conductive tape 210, as well as the shield surface 2 and the bottom edge 3. The conductive tape 210 covers at least a region of the shield plate 20 which will be irradiated with the ion beam IB.

The electrically conductive tape 210 includes an electrically conductive layer 212 and a sticky layer 214, for example. The conductive layer 212 is either foil of a metal (such as aluminum, copper, or carbon) or a conductive thin sheet (such as a graphite sheet). A glossy metal foil fabricated by rolling has fine surface roughness and can be preferably used as the conductive layer 212. The thickness of the conductive layer 212 is on the order of 50 μm, for example. Preferably, the surface of the conductive layer 212 is a specular surface. The sticky layer 214 is made of an electrically conductive adhesive and possesses heat resistance.

Figure 7:
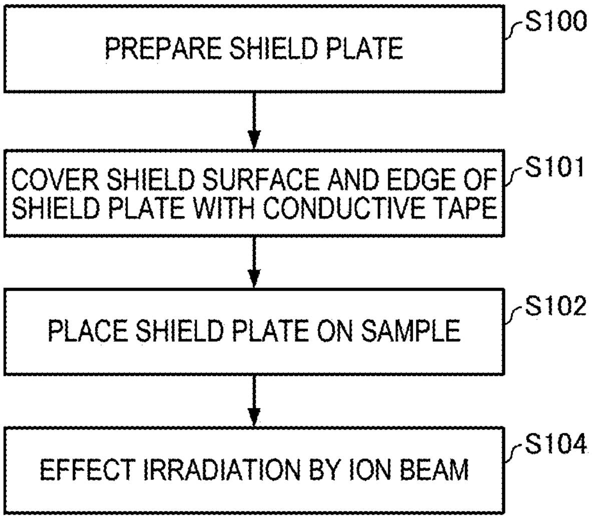
FIG. 7 is a flowchart illustrating the modification of the sample milling method of FIG. 5.

FIG. 7 is a flowchart illustrating the modification of the sample milling method of FIG. 6. This first modification differs from the sample milling method of FIG. 5 in that the step S101 of covering the bottom edge 3 and shield surface 2 of the shield plate 20 by the conductive tape 210 is performed prior to the step S102 of placing the shield plate 20 on the sample S. Only the differences with the foregoing sample milling method of FIG. 5 are described below. A description of similarities is omitted.

In the step S101 of covering the bottom edge 3 and shield surface 2 of the shield plate 20 by the conductive tape 210, the conductive tape 210 is stuck to the shield plate 20 without creases or air bubbles as shown in FIG. 6. Otherwise, the cross-sectional shape of the sample S may be adversely affected. Also, such creases or air bubbles may be selectively etched by the ion beam IB, perforating the conductive tape 210.

In the step S102 of placing the shield plate 20 on the sample S, the shield plate 20 whose shield surface 2 and bottom edge 3 are covered with the conductive tape 210 is mounted to the shield plate holder 30. At this time, the shield plate holder 30 supports the shield plate 20 such that only the bottom edge 3 covered with the conductive tape 210 abuts the sample S.

In the step S104 of effecting irradiation by the ion beam IB, the shield plate 20 whose shield surface 2 and bottom edge 3 are covered with the conductive tape 210 is irradiated with the ion beam IB. Because of the processing steps described so far, a cross section of the sample S can be formed.

The first modification of FIG. 7 includes the step of covering the shield surface 2 and the bottom edge 3 formed by both shield surface 2 and bottom surface 4 with the conductive tape 210 and so the consumed region of the shield plate 20 can be covered with the conductive tape 210. This can reduce the consumption of the shield plate 20. Furthermore, the shield plate 20 can be reused by replacing the stuck conductive tape 210 with another tape, thus achieving cost savings. In addition, since the bottom edge 3 is covered with the conductive tape 210, the bottom edge 3 can be formed cleanly and flatly. For example, if the conductive layer 212 of the electrically conductive tape 210 is made of glossy metal foil fabricated by rolling, it is not necessary to fabricate the shield surface 2 to a high accuracy by machining and grinding.

Figure 8:
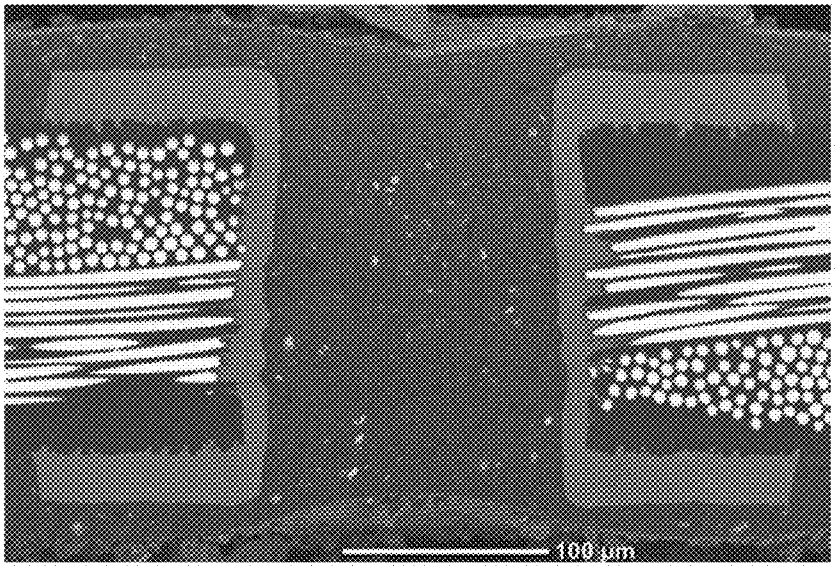
FIG. 8 is a scanning electron microscope image of a cross section through a printed circuit board.

FIG. 8 is an SEM (scanning electron microscope) image of a cross section of a printed-circuit board. The printed-circuit board has been milled with a broad ion beam by the use of the shield plate 20 whose shield surface 2 and bottom edge 3 are covered with aluminum foil tape. If machining is done using the shield plate 20 whose shield surface 2 and bottom edge 3 are covered with conductive tape, then it is possible to obtain a good cross section adapted for observation with a scanning electron microscope.

5.2. Second Modification

Figure 9:
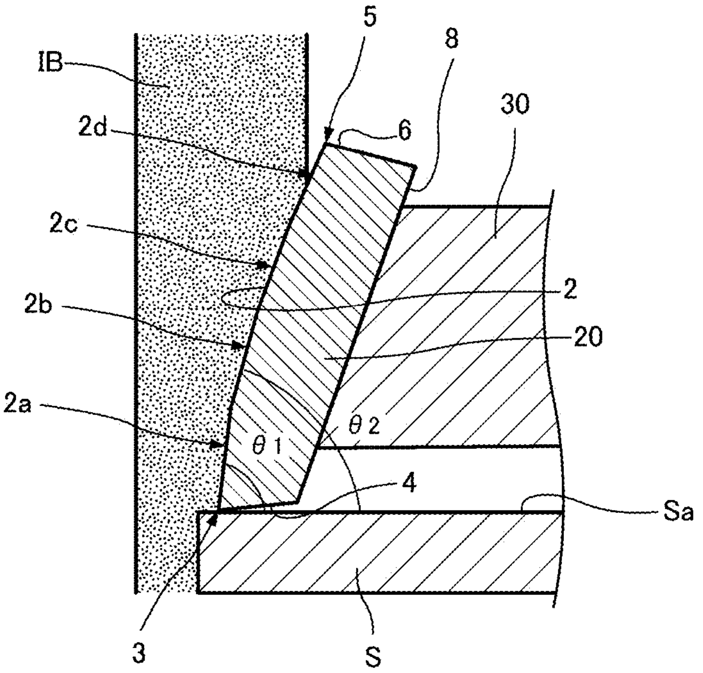
FIGS. 9-14 are schematic cross-sectional views of other modifications of the shield plate of FIG. 2.

FIG. 9 is a schematic cross-sectional view of another modification of the shield plate 20. As shown in FIG. 9, the shield surface 2 of the shield plate 20 may have a first tilted surface 2*a*, a second tilted surface 2*b*, a third tilted surface 2*c*, and a fourth tilted surface 2*d*.

The third tilted surface 2*c* is connected to the second tilted surface 2*b*. The angle formed between the third tilted surface 2*c* and the top surface Sa of the sample S (i.e., the tilt angle of the third tilted surface 2*c*) is smaller than the angle θ2 formed between the second tilted surface 2*b* and the top surface Sa of the sample S. The fourth tilted surface 2*d* is connected to the third tilted surface 2*c*. The angle made between the fourth tilted surface 2*d* and the top surface Sa of the sample S (i.e., the tilt angle of the fourth tilted surface 2*d*) is smaller than the angle made between the third tilted surface 2*c* and the top surface Sa of the sample S. The shield plate 20 shown in FIG. 9 can yield similar advantageous effect as those produced by the shield plate 20 shown in FIG. 2.

In the description of the examples of FIGS. 2 and 9, each tilted surface is a flat surface. Alternatively, each tilted surface may be a curved surface. In the shield plate 20 of FIG. 2, the shield surface 2 has two tilted surfaces. In the shield plate 20 of FIG. 9, the shield surface 2 has four tilted surfaces. There is no restriction on the number of tilted surfaces of the shield surface 2.

5.3. Third Modifications

Figure 10:
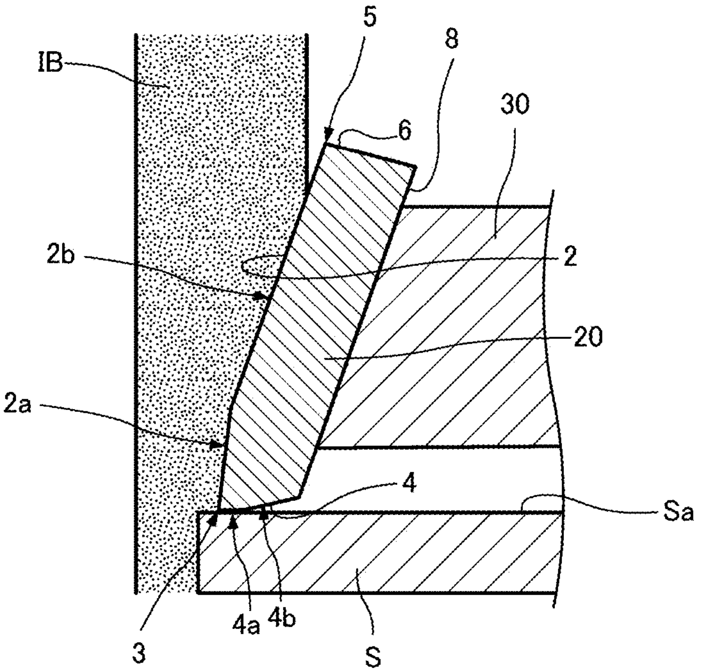
Figure 11:
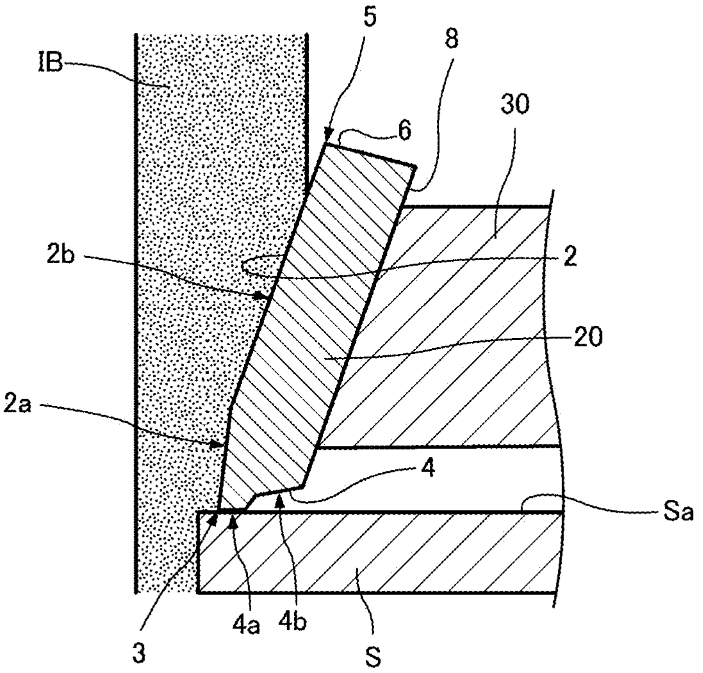

FIGS. 10-14 are schematic cross sections of further modifications of the shield plate 20. As shown in FIGS. 10 and 11, the bottom surface 4 may include a plurality of surfaces. In the shield plate 20 shown in FIG. 10, the bottom surface 4 includes a first bottom surface 4*a* and a second bottom surface 4*b*. The first bottom surface 4*a* and the shield surface 2 together form a bottom edge 3. The first bottom surface 4*a* is parallel to the top surface Sa of the sample S and in contact with the sample S. The second bottom surface 4*b* is connected to the first bottom surface 4*a* and tilted relative to the top surface Sa of the sample S. The second bottom surface 4*b* is not in contact with the top surface Sa of the sample S. In the shield plate 20 of FIG. 10, the bottom surface 4 is smaller in area than the shield surface 2 and so heat generated in the shield plate 20 is suppressed from flowing into the sample S in the same manner as for the shield plate 20 of FIG. 2.

In the shield plate 20 shown in FIG. 11, the bottom surface 4 includes a first bottom surface 4*a* and a second bottom surface 4*b*. The first bottom surface 4*a* and the shield surface 2 together form a bottom edge 3. The first bottom surface 4*a* is parallel to the top surface Sa of the sample S and in contact with the surface S. A step portion is formed between the first bottom surface 4*a* and the second bottom surface 4*b*. The second bottom surface 4*b* is not in contact with the top surface Sa of the sample S. In the shield plate 20 of FIG. 11, the bottom surface 4 is smaller in area than the shield surface 2 and, therefore, heat generated in the shield plate 20 is suppressed from flowing into the sample S in the same way as for the shield plate 20 of FIG. 2.

Figure 12:
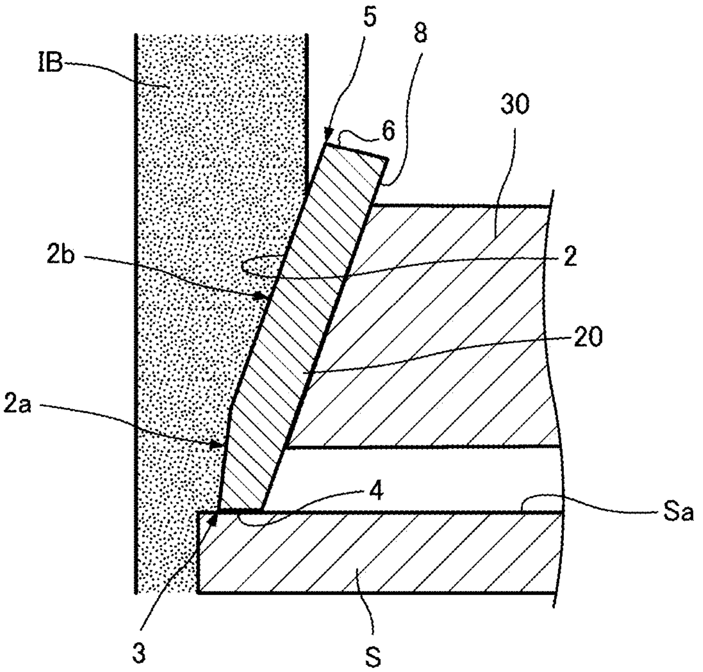

In the shield plate 20 of FIG. 12, the whole bottom surface 4 is in contact with the top surface Sa of the sample S. Because the bottom surface 4 is smaller in area than the shield surface 2, heat generated in the shield plate 20 can be suppressed from flowing into the sample S in the same way as for the shield plate 20 of FIG. 2.

Figure 13:
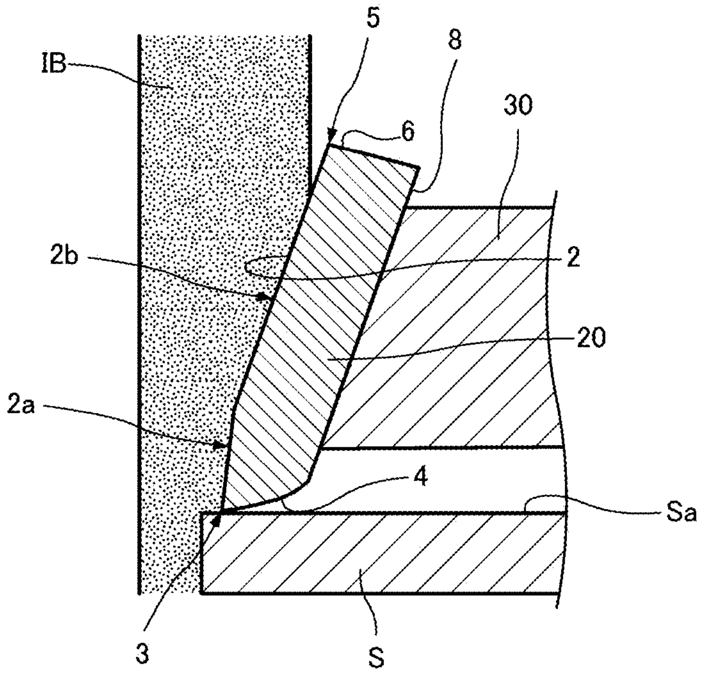
Figure 14:
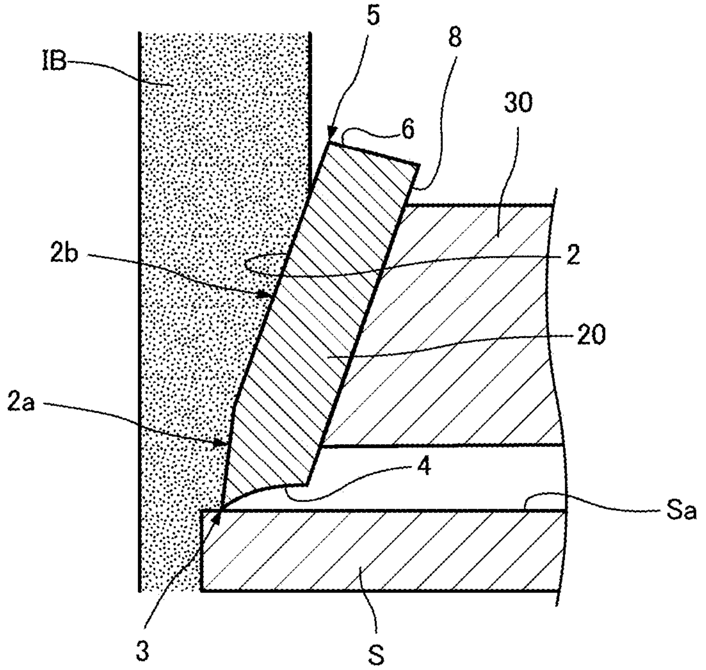

As shown in FIGS. 13 and 14, the bottom surface 4 may be a curved surface. In the shield plate 20 shown in FIG. 13, the bottom surface 4 is a convex curved surface. In the shield plate 20 shown in FIG. 14, the bottom surface 4 is a concave curved surface. In the shield plate 20 of FIG. 13 and shield plate 20 of FIG. 14, only the bottom edge 3 abuts the top surface Sa of the sample S in the same way as in the shield plate 20 of FIG. 2. Therefore, the shield plate 20 of FIG. 13 and the shield plate 20 of FIG. 14 can suppress heat generated in the shield plate 20 from flowing into the sample S in the same way as for the shield plate 20 of FIG. 2.

Note that the foregoing embodiments and modifications are merely exemplary and that the present invention is not restricted thereto. For example, the embodiments and modifications can be combined appropriately.

It is to be understood that the present invention is not restricted to the embodiments described above and that the invention can be practiced in variously modified forms. For example, the present invention embraces configurations substantially identical to the configurations described in the embodiments. What are meant by substantially identical configurations are configurations identical in functions, method, and results or in purposes and effects, for example. Furthermore, the present invention embraces configurations which are similar to those described in the foregoing embodiments except that nonessential portions have been replaced. In addition, the present invention embraces configurations which are identical in yielded advantageous effects or achieved purposes to the configurations described in the foregoing embodiments. Further, the present invention embraces configurations similar to those described in the foregoing embodiments except that a well-known technique is added.

What is claimed is:

1. A sample milling apparatus for milling a sample by irradiating it with an ion beam, said sample milling apparatus comprising:

an ion source for emitting the ion beam; and a shield plate placed on the sample and covering a part of the sample;

wherein said shield plate includes: a shield surface on which the ion beam impinges; and a bottom surface connected to the shield surface and forming a bottom edge; and wherein said bottom surface is smaller in area than said shield surface.

2. A sample milling apparatus as set forth in claim 1, further comprising a shield plate holder which mechanically supports said shield plate such that only the bottom edge formed by said shield surface and said bottom surface abuts said sample.

3. A sample milling apparatus as set forth in claim 1, wherein said shield surface comprises a first tilted surface tilted relative to a top surface of said sample and a second tilted surface at a smaller tilt angle relative to the top surface of the sample than the first tilted surface, and wherein the first tilted surface and the second surface are connected to the bottom surface and the first tilted surface, respectively.

4. A sample milling apparatus as set forth in claim 3, further comprising a third tilted surface having a smaller tilt angle relative to the top surface of said sample than said second tilt surface, and wherein the third tilted surface is connected to the second tilted surface.

5. A sample milling apparatus as set forth in claim 1, wherein said shield plate comprises a top surface connected to said shield surface;

wherein the shield surface and the top surface of the shield plate together form a top edge; and wherein a distance between the top edge and said bottom edge as taken along a line normal to the top surface of the sample is greater than a half value at half maximum of the intensity of the ion beam.

6. A sample milling apparatus as set forth in claim 1, further comprising a shield plate holder for mechanically supporting said shield plate, and wherein an area of contact between the shield plate and the shield plate holder is greater than an area of contact between the shield plate and the sample.

7. A sample milling apparatus as set forth in claim 6, wherein said shield plate holder has a coefficient of thermal conductivity higher than a coefficient of thermal conductivity of said shield plate.

8. A sample milling apparatus as set forth in claim 1, further comprising electrically conductive tape that covers said shield surface and said bottom edge formed by said shield surface and said bottom surface.

9. A shield plate for use with a sample milling apparatus for milling a sample by irradiating it with an ion beam, the shield plate being placed on the sample and covering a part of the sample, said shield plate comprising:

a shield surface on which the ion beam impinges; and a bottom surface connected to the shield surface and forming a bottom edge, the bottom surface being smaller in area than the shield surface.

10. A shield plate as set forth in claim 9, wherein said shield surface comprises both a first tilted surface tilted relative to a top surface of said sample and a second tilted surface at a smaller tilt angle relative to the top surface of the sample than the first tilted surface; and wherein the first tilted surface and the second tilted surface are connected to the bottom surface and the first tilted surface, respectively.

11. A shield plate as set forth in claim 10, further comprising a third tilted surface which is at a smaller tilt angle relative to the top surface of said sample than said second tilted surface and which is connected to the second tilted surface.

12. A sample milling method comprising the steps of:

preparing a shield plate as set forth in claim 9;

placing the shield plate on said sample and covering a part of the sample with the shield plate; and irradiating the shield plate and the sample with an ion beam.

13. A sample milling method as set forth in claim 12, further comprising the step of covering said shield surface and said bottom edge formed by said shield surface and said bottom surface with electrically conductive tape.

* * * * *